(12) United States Patent
Dai et al.

(10) Patent No.: US 7,898,253 B2
(45) Date of Patent: Mar. 1, 2011

(54) METHOD AND APPARATUS FOR REMOVING ARTIFACTS DURING MAGNETIC RESONANCE IMAGING

(75) Inventors: Yong Ming Dai, Shanghai (CN); Qiang Zhang, Shenzhen (CN); Weigang Wu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 189 days.

(21) Appl. No.: 12/394,826

(22) Filed: Feb. 27, 2009

(65) Prior Publication Data

US 2009/0219021 A1   Sep. 3, 2009

(30) Foreign Application Priority Data

Feb. 29, 2008   (CN) .................. 2008 1 0006471

(51) Int. Cl.
*G01V 3/00* (2006.01)
(52) U.S. Cl. ....................... 324/307; 324/309
(58) Field of Classification Search ......... 324/300–322; 600/407–445
See application file for complete search history.

(56) References Cited

U.S. PATENT DOCUMENTS

| | | | | |
|---|---|---|---|---|
| 5,167,232 A | * | 12/1992 | Parker et al. | 600/419 |
| 5,368,033 A | * | 11/1994 | Moshfeghi | 600/419 |
| 6,023,635 A | * | 2/2000 | Liu et al. | 600/410 |
| 6,037,771 A | * | 3/2000 | Liu et al. | 324/309 |
| 6,043,654 A | * | 3/2000 | Liu et al. | 324/309 |
| 6,201,393 B1 | * | 3/2001 | Bernstein et al. | 324/309 |
| 6,288,544 B1 | * | 9/2001 | Bernstein et al. | 324/309 |
| 6,459,264 B1 | * | 10/2002 | Fain et al. | 324/307 |
| 6,600,317 B1 | * | 7/2003 | Kumai et al. | 324/307 |
| 7,689,263 B1 | * | 3/2010 | Fung et al. | 600/410 |

* cited by examiner

*Primary Examiner*—Brij B Shrivastav
(74) *Attorney, Agent, or Firm*—Schiff Hardin LLP

(57) ABSTRACT

In a method and apparatus for removing artifacts during magnetic resonance imaging, a number of sets of 3D are generated data by scanning, with each set of 3D data containing a number of sets of 2D data. A weighted sum of all the 2D data corresponding to the same overlapped slab is formed. Maximum intensity projection of all the 2D data is implemented, followed by the superposition of the weighted sum data and the maximum intensity projection data to generate the 2D data corresponding to the overlapped slab. The maximum intensity projection of the 3D data formed by 2D data of non-overlapped slabs and 2D data of the corresponding overlapped slabs is implemented so as to generate a final image.

8 Claims, 4 Drawing Sheets

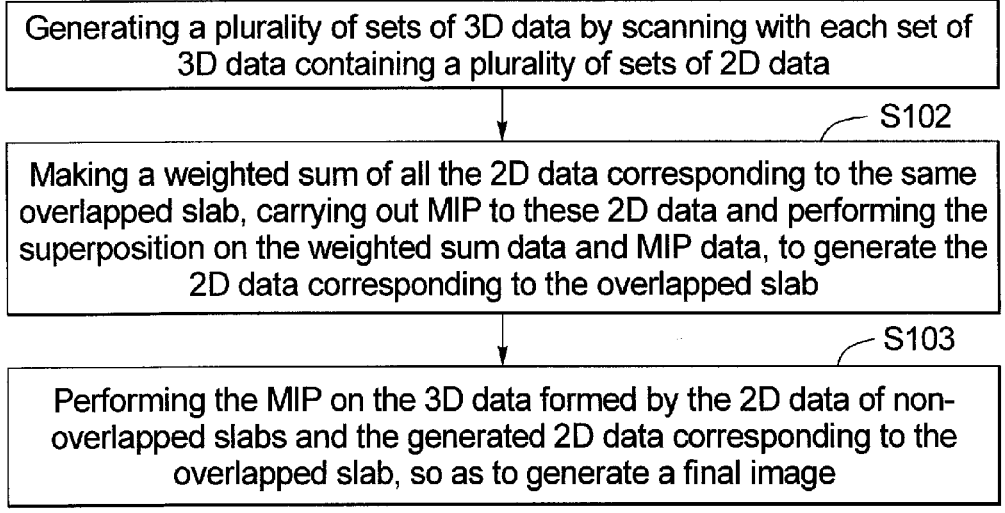

FIG. 1

S101 — Generating a plurality of sets of 3D data by scanning with each set of 3D data containing a plurality of sets of 2D data S102 — Making a weighted sum of all the 2D data corresponding to the same overlapped slab, carrying out MIP to these 2D data and performing the superposition on the weighted sum data and MIP data, to generate the 2D data corresponding to the overlapped slab S103 — Performing the MIP on the 3D data formed by the 2D data of non-overlapped slabs and the generated 2D data corresponding to the overlapped slab, so as to generate a final image

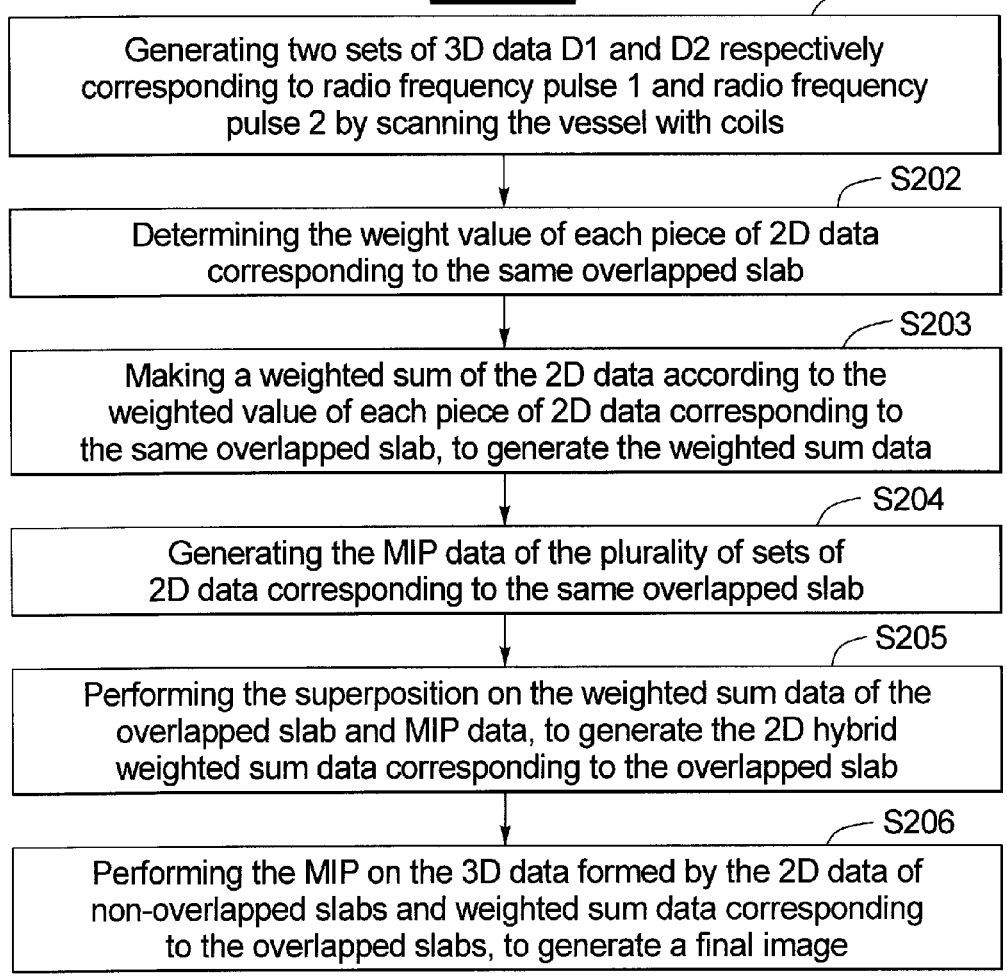

FIG. 2

S201 — Generating two sets of 3D data D1 and D2 respectively corresponding to radio frequency pulse 1 and radio frequency pulse 2 by scanning the vessel with coils S202 — Determining the weight value of each piece of 2D data corresponding to the same overlapped slab S203 — Making a weighted sum of the 2D data according to the weighted value of each piece of 2D data corresponding to the same overlapped slab, to generate the weighted sum data S204 — Generating the MIP data of the plurality of sets of 2D data corresponding to the same overlapped slab S205 — Performing the superposition on the weighted sum data of the overlapped slab and MIP data, to generate the 2D hybrid weighted sum data corresponding to the overlapped slab S206 — Performing the MIP on the 3D data formed by the 2D data of non-overlapped slabs and weighted sum data corresponding to the overlapped slabs, to generate a final image

FIG. 3

| Slab 1 | Radio Frequency pulse 1 | Radio Frequency pulse 2 |
|---|---|---|
| S1  | A1  ——— |  |
| S2  | A2  ——— |  |
| S3  | A3  ——— |  |
| S4  | A4  ——— |  |
| S5  | A5  ——— |  |
| S6  | A6  ——— |  |
| S7  | A7  ——— |  |
| S8  | A8  ——— |  |
| S9  | A9  ——— | ———  B1 |
| S10 | A10 ——— | ———  B2 |
| S11 | A11 ——— | ———  B3 |
| S12 |  | ———  B4 |
| S13 |  | ———  B5 |
| S14 |  | ———  B6 |
| S15 |  | ———  B7 |
| S16 |  | ———  B8 |
| S17 |  | ———  B9 |
| S18 |  | ———  B10 |
| S19 |  | ———  B11 |

FIG. 4

| Slab 1 | Radio Frequency pulse 1 | Radio Frequency pulse 2 |
|---|---|---|
| S1 | A1 —————— | |
| S2 | A2 —————— | |
| S3 | A3 —————— | |
| S4 | A4 —————— | |
| S5 | A5 —————— | |
| S6 | A6 —————— | |
| S7 | A7 —————— | |
| S8 | A8 —————— | |
| S9 | H1 —————— | |
| S10 | H2 —————— | |
| S11 | H3 —————— | |
| S12 | | —————— B4 |
| S13 | | —————— B5 |
| S14 | | —————— B6 |
| S15 | | —————— B7 |
| S16 | | —————— B8 |
| S17 | | —————— B9 |
| S18 | | —————— B10 |
| S19 | | —————— B11 |

METHOD AND APPARATUS FOR REMOVING ARTIFACTS DURING MAGNETIC RESONANCE IMAGING

BACKGROUND OF THE INVENTION

1. Field of the Invention

The present invention relates to magnetic resonance imaging (MRI) technology and, particularly to a method and apparatus for removing artifacts during magnetic resonance imaging.

2. Description of the Prior Art

MRI technology can be used for human vascular imaging, which is called magnetic resonance angiography (MRA). MRA is a magnetic resonance noninvasive vascular examination modality, which has a unique position in diagnosis of vascular diseases, and with the continuous development of the science and technology, and the continuous refinements and developments of the magnetic resonance imaging instrument, MRA is also being developed to image the vascular conditions more finely and accurately.

The time of flight (TOF) method is the most common imaging technology currently used in MRA. The principle of this technique is that: due to the position difference between the flow of blood and static tissue within a time range, it causes the tissue of a saturatedly scanned part to generate a relatively low MR signal, while the unsaturated blood generates a relatively high MR signal.

In the TOF method, maximum intensity projection (MIP) is a relatively common method for displaying an image. The maximum intensity projection is that in every projection direction only the pixels with maximum signal strength are retained. For 3D magnetic resonance TOF technology, typically there are a number of sets of radio frequency pulses at different positions which are used to perform the imaging on a human body, and there is overlapping between these pulses. When using MIP to display the image, artifacts will appear in the overlapped area, and when the artifacts are severe and will have a significant influence on the diagnosis.

SUMMARY OF THE INVENTION

An object of the present invention is to provide a method for removing artifacts during MRI, and to remove the image artifacts generated in the overlapped area of radio frequency pulses during 3D MRA.

Another object of the present invention is to provide an apparatus corresponding to the above method for removing artifacts during MRI.

The above objects in accordance with the present invention by a method for removing artifacts during MRI, including generating a number of sets of multi-channel 3D data by scanning a subject, with each set of 3D data containing a number of sets of 2D data. A weighted sum of all the 2D data is formed corresponding to the same overlapped slab. A maximum intensity projection of all the 2D data is implemented, followed by superposition of the weighted sum data and the maximum intensity projection data to generate 2D data corresponding to the overlapped slab. A maximum intensity projection of 3D data formed by the 2D data of non-overlapped slabs and the generated 2D data corresponding to the overlapped slab is then implemented to generate a final image.

The formation of the weighted sum of all the 2D data corresponding to the same overlapped slab can be implemented by determining the weight values of all the 2D data corresponding to the same overlapped slab according to the distances from the radio frequency pulse center slabs, to which the 2D data corresponding to the same overlapped slab correspond, to the overlapped slab. The weighted sum of all the 2D data corresponding to the same overlapped slab according to the weight values of the 2D data, so as to generate the weighted sum data.

The determination of the weight values of all the 2D data corresponding to the same overlapped slab according to the distances from the radio frequency pulse center slabs corresponding to all the 2D data corresponding to the same overlapped slab to said overlapped slab can proceed as follows. The shorter the distance from a radio frequency pulse center slab, to which the 2D data corresponding to the same overlapped slab correspond, to said overlapped slab, the greater the weight value of the 2D data. The longer the distance from a radio frequency pulse center slab, to which the 2D data corresponding to the same overlapped slab correspond, to the overlapped slab, the smaller said weight value of 2D data.

The superposition of the weighted sum data and maximum intensity projection data of the 2D data corresponding to the same overlapped slab to generate the 2D data corresponding to the overlapped slab can proceed as follows. At each pixel position, the maximum value of all the 2D data corresponding to the same overlapped slab at that position is retained to generate the maximum intensity projection data. The weighted sum data are superimposed in the maximum intensity projection data to generate the 2D data corresponding to the overlapped slab The above objects is also achieved in accordance with the present invention by an apparatus for removing artifacts during magnetic resonance imaging, that has a scanning unit for scanning an object with multi-channel coils to generate a number of sets of 3D data. Each set of the 3D data is composed of multiple sets of 2D data. An overlap processing unit produces a weighted sum of all the 2D data corresponding to the same overlapped slab, and implements a maximum intensity projection of said all the 2D data, and then superposes the weighted sum data and the maximum intensity projection data to generate the 2D data corresponding to the overlapped slab. An imaging unit implements a maximum intensity projection of the 3D data formed by the 2D data of non-overlapped slabs and the generated 2D data corresponding to the overlapped slab, so as to generate a final image.

The overlap processing unit can have a weighted sum module for generating a weighted sum of all the 2D data corresponding to the same overlapped slab to generate the weighted sum data, a maximum intensity projection module for performing the maximum intensity projection of all the 2D data corresponding to the same overlapped slab to generate the maximum intensity projection data, and a superposition module for performing the superposition of said weighted sum data and maximum intensity projection data to generate the 2D data corresponding to said overlapped slab.

At each pixel position, the maximum intensity projection module retains the maximum value of all the 2D data corresponding to the same overlapped slab at that position to generate the maximum intensity projection data.

The weighted sum module can determine the weight values of the 2D data according to the distances from the radio frequency pulse center slabs, to which the 2D data corresponding to the same overlapped slab correspond, to said overlapped slab. The weighted sum module then generates the weighted sum of all the 2D data corresponding to the same overlapped slab according to the weight values of the 2D data determined, so as to generate the weighted sum data.

In accordance with the present invention, after the 3D data are generated by scanning an object to be scanned, a weighted sum of all the 2D data corresponding to the same overlapped slab is formed, and the weighted sum data are superimposed with all the MIP data of the 2D data corresponding to the same overlapped slab to generate the 2D data corresponding to the overlapped slab. The MIP on the 3D data formed by the 2D data of non-overlapped slabs and the 2D data corresponding to the overlapped slab is performed to generate a final image. Due to the superposition of the weighted sum of all the 2D data and the maximum intensity projection data corresponding to the same overlapped slab, instead of simply using MIP to process the data of the overlapped slab as in the prior art, the important information for medical diagnosis from the data in the slabs at the boundaries of the radio frequency pulses is retained to a maximum extent, while the background signals are smoothed efficiently. Since the important information for medical diagnosis is retained to a maximum extent, the reliability of medical diagnosis is greatly improved.

BRIEF DESCRIPTION OF THE DRAWINGS

FIG. 1 is a flowchart of a method for removing artifacts during MRI proposed in the present invention.

FIG. 2 is a flowchart of the method for removing artifacts during MRI according to embodiment one of the present invention.

FIG. 3 is a schematic diagram of two sets of data D1 and D2 corresponding to radio frequency pulse 1 and radio frequency pulse 2 in a first embodiment.

FIG. 4 is a schematic diagram of 3D data newly generated in the first embodiment.

DESCRIPTION OF THE PREFERRED EMBODIMENTS

Figure 5:
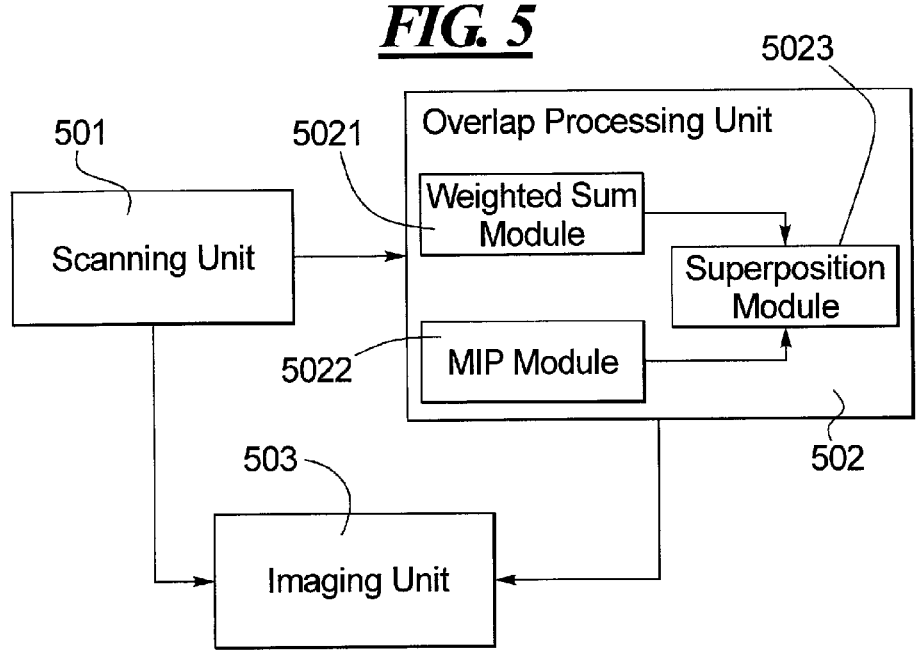
FIG. 5 is a structural diagram of apparatus for removing artifacts during MRI in a second embodiment of the present invention.

The method of the present invention uses a number of radio frequency pulses to perform the imaging, with the slabs where the radio frequency pulses overlap being the overlapped slabs and the slabs where the radio frequency pulses do not overlap being the non-overlapped slabs.

The invention is based on the insight that the reason the overlapped radio frequency pulses in 3D MRA produce image artifacts is because the overlapped parts are usually at the edges of two radio frequency pulses, where the vascular signals are weak, but the background signals are strong. Although performing MIP on the 2D data on the overlapped slab can make the vascular signals strongest, the background signals are also strengthened and the background becomes bright, leading to the appearance of bright bands in the final image. This problem is overcome in accordance with the invention by making the overlapped part to be a hybrid weighted sum of all the 2D data corresponding to the same overlapped slab, namely to perform a weighted sum of all the 2D data corresponding to the same overlapped slab and to perform the superposition of the weighted sum data and the MIP data of all the 2D data corresponding to the overlapped slab. In the weighted sum data, the background signals are weakened and smoothed, but this results in a loss of the vascular signal information. In the maximum intensity projection data, the vascular information is retained to a maximum extent, but the background is strengthened. The superposition of the two can achieve the retention of the vascular information to a maximum extent and at the same time weakening and smoothing the background signals, thereby efficiently avoiding the appearance of the bright band artifacts in the final image, and retaining the vascular information to a maximum degree.

FIG. 1 is a flowchart of a method for removing artifacts during MRI in accordance with the present invention. As shown in FIG. 1, at step S101, a number of sets of multichannel 3D data are generated by scanning, with each set of 3D data containing a number of sets of 2D data. In step S102; the weighted sum is made to all the 2D data corresponding to the same overlapped slab and the MIP is performed to the 2D data, and the superposition on the weighted sum data and maximum intensity projection data is performed to generate the 2D data corresponding to the overlapped slab. In step S103, the MIP is performed on the 3D data formed by the 2D data of the non-overlapped slabs and the generated 2D data corresponding to said overlapped slab to generate a final image.

The present invention will be described in detail below using several particular embodiments.

FIG. 2 is a flowchart of the method for removing artifacts during MRI according to an embodiment of the present invention. In this embodiment, it is assumed that there are two radio frequency pulses at different positions for performing the 3D magnetic resonance imaging on the vessels. As shown in FIG. 2, in this embodiment the method for removing artifacts mainly has the following steps.

In step S201, two sets of 3D data D1 and D2 are generated respectively corresponding to radio frequency pulse 1 and radio frequency pulse 2 by scanning the vessel with coils.

FIG. 3 is a schematic diagram of two sets of 3D data D1 and D2 corresponding to radio frequency pulse 1 and radio frequency pulse 2. As shown in FIG. 3, D1 contains 11 sets of 2D data, respectively from A1 to A11; D2 contains 11 sets of 2D data, respectively from B1 to B11. It can also be seen in FIG. 3 that, A1 to A11 correspond respectively to the images of 11 slabs from S1 to S11, and B1 to B11 correspond respectively to the images on 11 slabs from S9 to S19.

In step S202, the weight value of each piece of 2D data corresponding to the same overlapped slab is determined, that is the weight value of each piece of 2D data corresponding to the image of the same overlapped slab.

Referring to FIG. 3, in the slabs from S1 to S19, there are 3 overlapped slabs, S9, S10 and S11, and 16 non-overlapped slabs of S1 to S8 and S12 to S19. It can be seen from FIG. 3 that the center slab of the radio frequency pulse 1 is on S6, and the center slab of the radio frequency pulse 2 is on S14.

In the overlapped slab S9, there are two sets of 2D data A9 and B1 for its imaging, and therefore it is necessary to determine the weight values of A9 and B1 respectively. In the overlapped slab S10, there are two sets of 2D data A10 and B2 for its imaging, and therefore it is necessary to determine the weight values of A10 and B2 respectively. In the overlapped slab S11, there are two sets of 2D data A11 and B3 for its imaging, and therefore it is necessary to determine the weight values of A11 and B3 respectively.

The distance between the overlapped slab S9 and the center slab S6 of the radio frequency pulse 1 corresponding to the 2D data A9 for imaging S9 is 3 slabs, and the distance between the overlapped slab S9 and the center slab S14 of the radio frequency pulse 2 corresponding to the 2D data B1 for imaging S9 is 5 slabs. Since A9 is nearer to the center slab S6 of the radio frequency pulse 1, while B1 is relatively far away from the center slab S14 of the radio frequency pulse 2, the weight value of A9 is larger than that of B1. For example, the weight value of A9 can be determined as ⅝, and the weight value of B1 can be determined as ⅜.

The distance between the overlapped slab S10 and the center slab S6 of the radio frequency pulse 1 corresponding to the 2D data A10 for imaging S10 is 4 slabs, and the distance between the overlapped slab S10 and the center slab S14 of the radio frequency pulse 2 corresponding to the 2D data B2 for imaging S10 is 4 slabs. Since the distance between A10 and the center slab S6 of the radio frequency pulse 1 is equal to the distance between B2 and the center slab S14 of the radio frequency pulse 2, the weight value of A10 is the same as that of B2. The weight value of A10 can be determined as ½, and the weight value of B2 can be determined as ½.

The distance between the overlapped slab S11 and the center slab S6 of the radio frequency pulse 1 corresponding to the 2D data A11 for imaging S11 is 5 slabs, and the distance between the overlapped slab S11 and the center slab S14 of the radio frequency pulse 2 corresponding to the 2D data B3 for imaging S11 is 3 slabs. Since A11 is relatively far away from the center slab S6 of the radio frequency pulse 1, while B3 is nearer to the center slab S14 of the radio frequency pulse 2, the weight value of A11 is smaller than that of B3. For example, the weight value of A11 can be determined as ⅜, and the weight value of B3 can be determined as ⅝.

In step S203, the weighted sum for all the 2D data according to the determined weight value of each 2D data corresponding to the same overlapped slab is made, so as to generate the weighted sum data.

As to the overlapped slab S9, the weight value of 2D data A9 is ⅝, and the weight value of 2D data B1 is ⅜, thus, A9 and B1 are weight-summed according to equation (1), to generate the 2D weighted sum data C9:

$$C9 = \frac{5}{8} \cdot (A9) + \frac{3}{8} \cdot (B1) \quad (1)$$

As to the overlapped slab S10, the weight values of 2D data A10 and B2 are both ½, thus, A10 and B2 are weight-summed according to equation (2), to generate the 2D weighted sum data C10:

$$C10 = \frac{1}{2} \cdot (A10) + \frac{1}{2} \cdot (B2) \quad (2)$$

As to the overlapped slab S11, the weight value of 2D data A11 is ⅜, and the weight value of 2D data B3 is ⅝, thus, A11 and B3 are weight-summed according to equation (3), to generate the 2D weighted sum data C11:

$$C11 = \frac{3}{8} \cdot (A11) + \frac{5}{8} \cdot (B3). \quad (3)$$

In step S204, the MIR data of all the 2D data corresponding to the same overlapped slab is generated.

For the overlapped slab S9, at each pixel position, the maximum values of the 2D data A9 and B1 at the corresponding pixel are retained, so as to generate the MIP data M9.

For the overlapped slab S10, at each pixel position, the maximum values of the 2D data A10 and B2 at the corresponding pixel are retained, so as to generate the MIP data M10.

For the overlapped slab S11, at each pixel position, the maximum values of the 2D data A11 and B3 at the corresponding pixel are retained, so as to generate the MIP data M11.

In step S205, the superposition of the weighted sum data of the overlapped slab and the MIP data is performed, so as to generate the 2D hybrid weighted sum data corresponding to the overlapped slab.

For the overlapped slab S9, the superposition of the weighted sum data C9 and the MIP data M9 is performed, so as to generate the hybrid weighted sum data H9.

For the overlapped slab S10, the superposition of the weighted sum data C10 and the MIP data M10 is performed, so as to generate the hybrid weighted sum data H10.

For the overlapped slab S11, the superposition of the weighted sum data C11 and the MIP data M11 is performed, so as to generate the hybrid weighted sum data H11.

In step S206, the MIP on the 3D data formed by the 2D data of non-overlapped slabs and the weighted sum data corresponding to the overlapped slabs is performed to generate a final image.

MIP refers to the projection in one direction of the maximum value in a row or column in the image, namely the values of the row or column are changed to the maximum value of the row or column. The operation of performing the MIP on the 3D data can form several 2D images in several directions, for example, it can form three 2D images in X, Y and Z directions which are perpendicular to one another.

It can be seen in FIG. 3 that, in the embodiment, there are in total 16 non-overlapped slabs, i.e. S1-S8 and S12-S19, and 3 overlapped slabs S9, S10 and S11 respectively. In the newly formed 3D data, on the non-overlapped slabs, the 2D data originally corresponding to the slabs are still used, while on the overlapped slabs, the 2D data generated after performing the hybrid weighted sum are used.

FIG. 4 is a schematic diagram of the newly generated 3D data. As shown in FIG. 4, in the newly generated 3D data, the 2D data of 19 slabs are as follows:

the 2D data of the non-overlapped slabs from slabs S1 to S8 are respectively A1 to A8;

the 2D data of the overlapped slab S9 are H9 generated at step S205;

the 2D data of the overlapped slab S10 are H10 generated at step S205;

the 2D data of the overlapped slab S11 are H11 generated at step S205; and the 2D data of the non-overlapped slabs from slabs S12 to S19 are respectively B4 to B11.

MIP is performed on the newly generated 3D data, so as to generate the final image.

It should be noted that in other embodiments of the present invention, other weight value assigning modes can also be used, as long as they are based on the precondition of determining the weight values according to the distance between said overlapped slab and the center slab of the radio frequency pulse corresponding to the 2D data corresponding to the same overlapped slab.

The present invention also provides an apparatus corresponding to the above method for removing artifacts during MRI.

FIG. 5 is a structural diagram of an apparatus for removing artifacts during MRI of embodiment two of the present invention. As shown in FIG. 5, the apparatus has a scanning unit 501, an overlap processing unit 502 and an imaging unit 503. In this case, the scanning unit 501 generates a number of sets of 3D data by scanning, with each set of 3D data containing a number of sets of 2D data; the overlap processing unit 502 makes a weighted sum all the 2D data corresponding to the same overlapped slab, carries out the MIP to such 2D data, and performs the superposition of the weighted sum data and the MIP data to generate the 2D data corresponding to the overlapped slab, The imaging unit 503 performs the MIP on the 3D data formed by the 2D data of non-overlapped slabs and the generated 2D data corresponding to the overlapped slabs to generate the final image.

The overlap processing unit 502 has a weighted sum module 5021, a MIP module 5022 and a superposition module 5023. The weighted sum module 5021 forms the weighted sum of all the 2D data corresponding to the same overlapped slab to generate the weighted sum data. The MIP module 5022 performs the MIP on all the 2D data corresponding to the same overlapped slab to generate the MIP data. The superposition module 5023 performs the superposition of the weighted sum data and MIP data, to generate the 2D data corresponding to said overlapped slab.

At each pixel position, the MIP module 5022 retains the maximum value of all the 2D data corresponding to the same overlapped slab at that pixel position to generate the MIP data.

The weighted sum module 5021 determines respectively the weight values of the 2D data according to the distances from the radio frequency pulse center slabs, to which the 2D data corresponding to the same overlapped slab correspond, to said overlapped slab; and forms a weighted sum of all the 2D data corresponding to the same overlapped slab according to the weight values of the 2D data determined, so as to generate the weighted sum data.

By using the above method and apparatus, since the hybrid weighted sum is first performed on all the 2D images corresponding to the same overlapped slab, this retains the vascular signals to a maximum extent, and at the same time it weakens and smoothes the background signals, and therefore the appearance of the bright band artifacts in the final image can be efficiently avoided.

Figure 6:
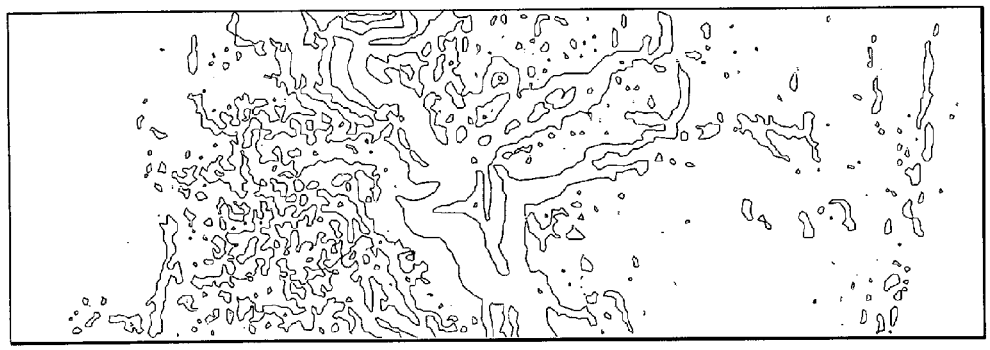
FIG. 6 is a schematic diagram of a final image obtained by using MIP on the overlapped slab.

FIG. 6 is a schematic diagram of a final image obtained by using MIP in the overlapped slabs. As shown in FIG. 6, by using the method in the prior art, namely by simply using MIP in all slabs to obtain the final image, there is an apparent bright band artifact in the final generated image.

Figure 7:
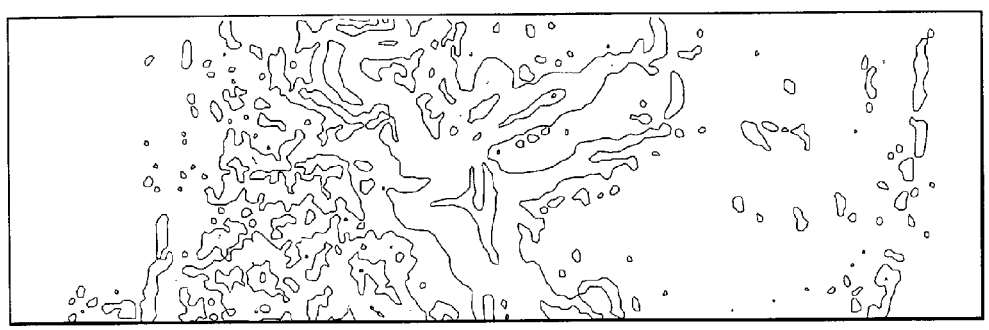
FIG. 7 is a schematic diagram of a final image obtained by making a hybrid weighted sum on the overlapped slab.

FIG. 7 is a schematic diagram of a final image obtained by making the hybrid weighted sum in the overlapped slab. As shown in FIG. 7, by using the method proposed in the present invention, namely by forming the weighted sum of all the 2D data corresponding to the same overlapped slab, then performing the superposition of the weighted sum data and the MIP data of all the 2D data of the overlapped slab to generate the 2D data corresponding to the overlapped slab, and implementing the MIP on the 3D data formed by the 2D data of non-overlapped slabs and the new 2D data corresponding to the overlapped slabs, the artifacts are weakened in the final generated image significantly.

By comparing the FIG. 6 with FIG. 7 it can be seen that, in the present invention, the hybrid weighted sum is performed on the plurality of sets of 2D data corresponding to the images of the overlapped slabs, instead of processing the data of the overlapped slabs by only using MIP as in the prior art, and this makes the important information for medical diagnosis from the 2D data on the slabs of the radio frequency pulse boundary be retained to the maximum extent, while the background signals are smoothed efficiently. As the important information for medical diagnosis is retained to the maximum extent, the reliability of medical diagnosis is significantly improved.

Although modifications and changes may be suggested by those skilled in the art, it is the intention of the inventors to embody within the patent warranted hereon all changes and modifications as reasonably and properly come within the scope of their contribution to the art.

We claim as our invention:

1. An apparatus for removing artifacts in magnetic resonance imaging, comprising the steps of:
    a magnetic resonance scanner that acquires a plurality of 3D data sets of magnetic resonance data from a subject by irradiating the subject with a plurality of radio-frequency pulses that excite nuclear spins in a plurality of slabs in the subject, each 3D data set being comprised of a plurality of 2D data sets, each of said 3D data sets comprising 2D data sets respectively acquired from slabs in the subject that do not overlap with slabs for 2D data sets in others of said 3D data sets, and containing 2D data sets from slabs that overlap slabs for which said 2D data sets are acquired in others of said 3D data sets;
    a processor configured to form, for each of said overlapped slabs, a weighted sum of all of the 2D data sets acquired therefrom, to obtain weighted sum data, and to implement a maximum intensity projection of all of said 2D data sets therefrom, to obtain maximum intensity projection data, and to superimpose said weighted sum data and said maximum intensity projection data to generate generated 2D data for that overlapped slab; and
    said processor being configured to implement a maximum intensity projection of the 3D data sets using the respective 2D data sets acquired from non-overlapped slabs in the respective 3D data sets and the generated 2D data for each overlapped slab, to generate final maximum intensity projection data, and to make said final maximum intensity projection data available in a form allowing reconstruction of a magnetic resonance image of the subject therefrom.

2. An apparatus as claimed in claim 1 wherein each of said radio-frequency pulses has a center that results in a center slab in each of said 3D data sets, and wherein said processor is configured to form said weighted sum of all of the 2D data sets in each overlapped slab by:
    assigning a weight value to each 2D data set dependent on a distance of the slab from which that 2D set was acquired from the center slab in the 3D data set containing that 2D data set; and
    forming said weighted sum of all of said 2D data sets acquired from said overlapped slab with the respective 2D data sets acquired from said overlapped slab being weight with said respective weight values.

3. An apparatus as claimed in claim 2 wherein said processor is configured to assign progressively higher weight values to respective ones of said 2D data sets the closer the respective slabs, from which the respective 2D data sets were acquired, are to the center slab in the 3D data set containing the respective 2D data sets.

4. An apparatus as claimed in claim 1 wherein each of said 2D data sets represents pixels at respective pixel positions, and wherein said processor is configured to implement said maximum intensity projection of all of said 2D data sets in each overlapped slab by:
    at each pixel position, identifying a maximum value among all of the 2D data sets acquired from that overlapped slab; and
    implementing the maximum intensity projection, to generate said maximum intensity projection data, using the respective maximum values for said pixel positions.

5. A method for removing artifacts in magnetic resonance imaging, comprising the steps of:

acquiring a plurality of 3D data sets of magnetic resonance data from a subject by irradiating the subject with a plurality of radio-frequency pulses that excite nuclear spins in a plurality of slabs in the subject, each 3D data set being comprised of a plurality of 2D data sets, each of said 3D data sets comprising 2D data sets respectively acquired from slabs in the subject that do not overlap with slabs for 2D data sets in others of said 3D data sets, and containing 2D data sets from slabs that overlap slabs for which said 2D data sets are acquired in others of said 3D data sets;

for each of said overlapped slabs, forming a weighted sum of all of the 2D data sets acquired therefrom, to obtain weighted sum data, and implementing a maximum intensity projection of all of said 2D data sets therefrom, to obtain maximum intensity projection data, and superimposing said weighted sum data and said maximum intensity projection data to generate generated 2D data for that overlapped slab; and implementing a maximum intensity projection of the 3D data sets using the respective 2D data sets acquired from non-overlapped slabs in the respective 3D data sets and the generated 2D data for each overlapped slab, to generate final maximum intensity projection data, and making said final maximum intensity projection data available in a form allowing reconstruction of a magnetic resonance image of the subject therefrom.

6. A method as claimed in claim 5 wherein each of said radio-frequency pulses has a center that results in a center slab in each of said 3D data sets, and comprising forming said weighted sum of all of the 2D data sets in each overlapped slab by:

assigning a weight value to each 2D data set dependent on a distance of the slab from which that 2D set was acquired from the center slab in the 3D data set containing that 2D data set; and forming said weighted sum of all of said 2D data sets acquired from said overlapped slab with the respective 2D data sets acquired from said overlapped slab being weight with said respective weight values.

7. A method as claimed in claim 6 comprising assigning progressively higher weight values to respective ones of said 2D data sets the closer the respective slabs, from which the respective 2D data sets were acquired, are to the center slab in the 3D data set containing the respective 2D data sets.

8. A method as claimed in claim 5 wherein each of said 2D data sets represents pixels at respective pixel positions, and comprising implementing said maximum intensity projection of all of said 2D data sets in each overlapped slab by:

at each pixel position, identifying a maximum value among all of the 2D data sets acquired from that overlapped slab; and implementing the maximum intensity projection, to generate said maximum intensity projection data, using the respective maximum values for said pixel positions.

* * * * *